(12) United States Patent
Sicken et al.

(10) Patent No.: US 7,273,901 B2
(45) Date of Patent: Sep. 25, 2007

(54) FLAME RETARDANT DISPERSION

(75) Inventors: Martin Sicken, Cologne (DE); Susanne Knop, Hamburg (DE); Sebastian Hoerold, Diedorf (DE); Harald Bauer, Kerpen (DE)

(73) Assignee: Clariant Produkte (Deutschland) GmbH, Sulzbach (DE)

( * ) Notice: Subject to any disclaimer, the term of this patent is extended or adjusted under 35 U.S.C. 154(b) by 429 days.

(21) Appl. No.: 10/794,019

(22) Filed: Mar. 5, 2004

(65) Prior Publication Data
US 2007/0203270 A1  Aug. 30, 2007

(30) Foreign Application Priority Data
Mar. 5, 2003 (DE) ............................. 103 09 805

(51) Int. Cl.
*C08K 5/5313* (2006.01)
(52) U.S. Cl. .................. 524/126; 524/133; 524/135; 252/609; 252/610; 252/611
(58) Field of Classification Search ............... 524/126, 524/133, 135; 252/609–611
See application file for complete search history.

(56) References Cited

U.S. PATENT DOCUMENTS

| | | | | |
|---|---|---|---|---|
| 3,078,248 | A * | 2/1963 | Ben | 524/711 |
| 3,549,651 | A * | 12/1970 | Reimschuessel et al. | 524/143 |
| 3,594,347 | A * | 7/1971 | Lazarus et al. | 524/135 |
| 3,900,444 | A * | 8/1975 | Racky et al. | 524/126 |
| 4,036,811 | A | 7/1977 | Noetzel et al. | |
| 4,078,016 | A * | 3/1978 | Kramer | 525/389 |
| 4,092,276 | A * | 5/1978 | Narayan | 521/108 |
| 4,097,400 | A | 6/1978 | Wortmann et al. | |
| 4,136,154 | A * | 1/1979 | Staendeke et al. | 423/265 |
| 4,853,424 | A | 8/1989 | Staendeke et al. | |
| 5,064,595 | A * | 11/1991 | Hackert | 264/130 |
| 5,312,853 | A | 5/1994 | Staendeke et al. | |
| 5,719,200 | A | 2/1998 | Staendeke et al. | |
| 5,780,534 | A | 7/1998 | Kleiwer et al. | |
| 6,013,707 | A | 1/2000 | Kleiwer et al. | |
| 6,156,825 | A | 12/2000 | Horold et al. | |
| 6,207,736 | B1 | 3/2001 | Nass et al. | |
| 6,255,371 | B1 | 7/2001 | Schlosser et al. | |
| 6,344,158 | B1 | 2/2002 | Schlosser et al. | |
| 6,365,071 | B1 | 4/2002 | Jenewein et al. | |
| 6,420,459 | B1 * | 7/2002 | Horold | 523/451 |
| 6,509,401 | B1 | 1/2003 | Jenewein et al. | |
| 6,547,992 | B1 | 4/2003 | Schlosser et al. | |

FOREIGN PATENT DOCUMENTS

| | | |
|---|---|---|
| DE | 2252258 | 5/1974 |
| DE | 2447727 | 4/1976 |
| DE | 19614424 | 10/1997 |
| DE | 19903707 | 8/2000 |
| EP | 0699708 | 3/1996 |
| EP | 1024167 | 8/2000 |
| EP | 1024168 | 8/2000 |
| EP | 1070754 | 1/2001 |
| WO | WO96/16948 | 6/1996 |
| WO | WO98/39306 | 9/1998 |

OTHER PUBLICATIONS

EPO Search Report for EP 04004108, mailed Dec. 28, 2004.
EP Search Report for EP 04004108, mailed Oct. 20, 2005.

* cited by examiner

*Primary Examiner*—Peter Szekely
(74) *Attorney, Agent, or Firm*—Anthony A. Bisulca

(57) ABSTRACT

The invention relates to a novel flame retardant dispersion for thermoplastic and thermoset polymers, comprising, as component A, a phosphinic salt of the formula (I), and/or a diphosphinic salt of the formula (II), and/or polymers of these,

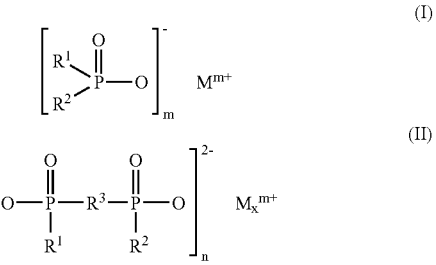

where
$R^1$ and $R^2$ are identical or different and are $C_1$-$C_6$-alkyl, linear or branched, and/or aryl;
$R^3$ is $C_1$-$C_{10}$-alkylene, linear or branched, $C_6$-$C_{10}$-arylene, -alkylarylene, or -arylalkylene;
M is Mg, Ca, Al, Sb, Sn, Ge, Ti, Zn, Fe, Zr, Ce, Bi, Sr, Mn, Li, Na and/or K;
m is from 1 to 4;
n is from 1 to 4;
x is from 1 to 4,
and, as component B, a nitrogen-containing synergist or a phosphorus/nitrogen flame retardant, and, as component C, a liquid compound.

36 Claims, No Drawings

FLAME RETARDANT DISPERSION

The present invention relates to a flame retardant dispersion, to a process for preparing this flame retardant dispersion, and also to the use of the dispersion.

Organophosphorus compounds are used as flame retardants for thermoplastics and thermosets, e.g. polyamides, polyesters, unsaturated polyester resins, and epoxy resins.

The salts of phosphinic acids (phosphinates) in particular have proven to be effective flame-retardant additives; this applies not only to the alkali metal salts (DE-A-2 252 268) but also to the salts of other metals (DE-A-2 447 727).

Calcium phosphinates and aluminum phosphinates have been described as particularly effective in polyesters, and, when compared with the alkali metal salts, impair the properties of the polymeric molding composition materials to a lesser degree (EP-A-0 699 708).

Synergistic combinations of phosphinates with certain nitrogen-containing compounds have also been found, these being more effective flame retardants than the phosphinates alone in very many polymers (U.S. Pat. No. 6,255,371, DE-A-196 14 424, DE-A-199 03 707).

Because thermoplastic and thermoset resins such as polyamides, polyesters, unsaturated polyester resins, epoxy resins, and polyurethanes are combustible they require flame retardants for some applications. The market has increasing requirements for fire protection and for environmental compatibility of products, and the level of interest in halogen-free flame retardants is therefore increasing, examples of these being solid organophosphorus flame retardants, or combinations of products of this type with other flame retardants, preferably with nitrogen-containing synergists, or phosphorus/nitrogen flame retardants.

In the abovementioned application sectors, the processing of the solid organophosphorus flame retardant component can be rendered difficult especially when liquid components are used in the process. There is the risk that lack of adequate dispersion or wetting during the process will prevent homogeneous incorporation of the flame retardant.

It is therefore an object to improve the processibility of flame retardant compositions. According to the invention, the object is achieved by treating and homogenizing the organophosphorus flame retardant component with a liquid component prior to the processing of the plastic. Surprisingly, it has been found here that the uniformity of distribution of the organophosphorus flame retardant component in the polymer is improved if it is used in the form of a dispersion. The better-distributed particles give more effective flame-retardant action. Other results of the better distribution of the particles are better and more pleasing surface finish and better and more pleasing surface quality. In addition, this method can also give the polymeric material better mechanical properties.

U.S. Pat. No. 4,097,400 describes mixtures of the solid flame retardant ammonium polyphosphate in polyols for preparing polyurethanes.

The invention therefore provides flame retardant dispersions which comprise, as flame retardant component A, from 1 to 90% by weight of phosphinic salt of the formula (I) and/or a diphosphinic salt of the formula (II), and/or polymers of these,

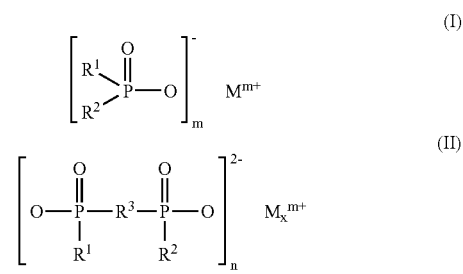

where $R^1$ and $R^2$ are identical or different and are $C_1$-$C_6$-alkyl, linear or branched, and/or aryl;

$R^3$ is $C_1$-$C_{10}$-alkylene, linear or branched, $C_8$-$C_{10}$-arylene, -alkylarylene, or -arylalkylene;

M is Mg, Ca, Al, Sb, Sn, Ge, Ti, Zn, Fe, Zr, Ce, Bi, Sr, Mn, Ll, Na and/or K;

m is from 1 to 4;

n is from 1 to 4;

x is from 1 to 4, and comprises, as component B, from 0 to 75% by weight of a nitrogen-containing synergist or a phosphorus/nitrogen flame retardant or zinc borate, and comprises, as component C, from 10 to 90% by weight of a liquid component.

Preferred meanings of $R^1$ and $R^2$, identical or different, are $C_1$-$C_6$-alkyl, linear or branched, and/or phenyl.

Particularly preferred meanings of $R^1$ and $R^2$, identical or different, are methyl, ethyl, n-propyl, isopropyl, n-butyl, tert-butyl, n-pentyl, and/or phenyl.

A preferred meaning of $R^3$ is methylene, ethylene, n-propylene, isopropylene, n-butylene, tert-butylene, n-pentylene, n-octylene, or n-dodecylene.

Another preferred meaning of $R^3$ is phenylene or naphthylene.

Another preferred meaning of $R^3$ is methylphenylene, ethylphenylene, tert-butylphenylene, methylnaphthylene, ethylnaphthylene, or tert-butylnaphthylene.

Another preferred meaning of $R^3$ is phenylmethylene, phenylethylene, phenylpropylene, or phenylbutylene.

M is preferably calcium, aluminum, or zinc.

Protonated nitrogen bases are preferably the protonated bases of ammonia, melamine, triethanolamine, and in particular $NH_4^+$.

The invention also provides flame retardant compositions which comprise synergistic combinations of the phosphinates mentioned with certain compounds which are more effective as flame retardants than the phosphinates alone in very many polymers (U.S. Pat. No. 6,255,371, DE-A-196 14 424, and DE-A-199 03 707). The flame-retardant action of the phosphinate mixtures may be improved via combination with other flame retardants, preferably with nitrogen-containing synergists, or with phosphorus/nitrogen flame retardants.

The nitrogen-containing synergists preferably comprise those of the formulae (III) to (VIII), or a mixture of these,

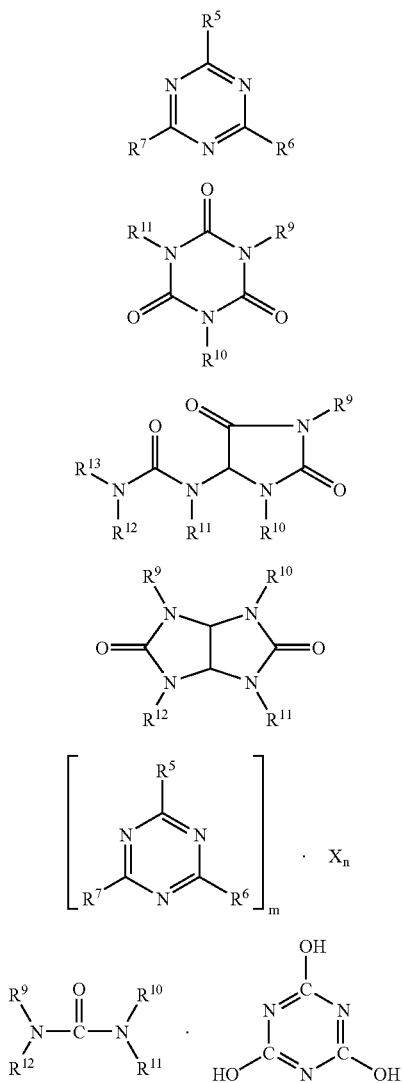

where
R⁵ to R⁷ are hydrogen, $C_1$-$C_8$-alkyl, $C_5$-$C_{16}$-cycloalkyl or -alkylcycloalkyl, optionally substituted with a hydroxy or a $C_1$-$C_4$-hydroxyalkyl function, $C_2$-$C_8$-alkenyl, $C_1$-$C_8$-alkoxy, -acyl, -acyloxy, $C_6$-$C_{12}$-aryl or -arylalkyl, —OR⁸, or —N(R⁸)R⁹, or else a system of N-alicyclic or N-aromatic nature, R⁸ is hydrogen, $C_1$-$C_8$-alkyl, $C_5$-$C_{16}$-cycloalkyl or -alkylcycloalkyl, optionally substituted with a hydroxy or a $C_1$-$C_4$-hydroxyalkyl function, $C_2$-$C_8$-alkenyl, $C_1$-$C_8$-alkoxy, -acyl, -acyloxy, or $C_6$-$C_{12}$-aryl or -arylalkyl, R⁹ to R¹³ are the same as the groups for R⁸, or else —O—R⁸, m and n, independently of one another, are 1, 2, 3, or 4, X is acids which can form adducts with triazine compounds (III);

or comprise oligomeric esters of tris(hydroxyethyl) isocyanurate with aromatic polycarboxylic acids.

The nitrogen-containing synergists preferably comprise benzoguanamine, tris(hydroxyethyl) isocyanurate, allantoin, glycoluril, melamine, melamine cyanurate, dicyandiamide, guanidine and carbodiimides.

The nitrogen synergists preferably comprise condensation products of melamine. Examples of condensation products of melamine are melem, melam, or melon, or more highly condensed compounds of this type, and also mixtures of the same, and, by way of example, can be prepared by a process as described in PCT/WO-A-96/16948.

The phosphorus/nitrogen flame retardants preferably comprise reaction products of melamine with phosphoric acid or with condensed phosphoric acids, or comprise reaction products of condensation products of melamine with phosphoric acid or with condensed phosphoric acids, or else comprise a mixture of the products mentioned.

The reaction products with phosphoric acid or with condensed phosphoric acids are compounds which arise via reaction of melamine or of the condensed melamine compounds, such as melam, melem, or melon etc., with phosphoric acid. Examples of these are dimelamine phosphate, dimelamine pyrophosphate, melamine phosphate, melamine pyrophosphate, melamine polyphosphate, melam polyphosphate, melon polyphosphate, and melem polyphosphate, and mixed polysalts, e.g. those described in PCT/WO 98/39306.

The phosphorus/hydrogen flame retardant particularly preferably comprises melamine polyphosphate.

The phosphorus/nitrogen flame retardants preferably comprise nitrogen-containing phosphates of the formulae $(NH_4)_y H_{3-y} PO_4$ or $(NH_4PO_3)_z$, where y is from 1 to 3 and z is from 1 to 10,000.

The phosphorus/nitrogen flame retardants are preferably ammonium hydrogenphosphate, ammonium dihydrogenphosphate, or ammonium polyphosphate.

Liquid components which may be used are any of the products which are used in the respective process for producing or processing the plastics, or which are used additionally, without adversely affecting the abovementioned processes. Examples of liquid additives of this type are monomers which are used in polymerization, polyaddition, or polycondensation reactions, solvents which are used during the processing of the plastic, liquid polymeric starting materials, and also stabilizers, other flame retardants, and other auxiliaries.

Suitable monomers are the diols used in preparing polyesters. Examples are ethylene glycol, 1,2-propanediol, 1,3-propanediol, and butanediols.

Other suitable monomers are the di- and polyamines used in preparing polyamides. Examples are ethylenediamine, propylenediamine, and also tetra-, penta-, and hexamethylenediamine.

Other suitable monomers are olefinic compounds which are used in polymerization reactions. Examples are styrene or methyl methacrylate.

Other suitable monomers are diisocyanates which are used in preparing polyurethanes. Examples are tolylene 2,4-diisocyanate (2,4-TDI), tolylene 2,6-diisocyanate (2,6-TDI), 4,4'-diisocyanatodiphenylmethane (MDI), naphthalene 1,5-diisocyanate (NDI), hexamethylene 1,6-diisocyanate (HDI), and isophorone diisocyanate (IPDI).

Suitable liquid polymeric starting materials are polyols and polyisocyanates which are used for preparing polyurethanes.

Examples of polyols are polyethylene glycols, polypropylene glycols, polyether polyols, and polyester polyols.

Other suitable liquid polymeric starting materials are synthetic resins, which according to DIN 55958 are synthetic resins which are prepared via a polymerization, polyaddition, or polycondensation reaction.

Examples are the oligomeric and polymeric resins and hardeners used in preparing unsaturated polyester resins.

Examples of liquid polymeric starting materials of this type are solutions of polycondensation products composed of saturated and unsaturated dicarboxylic acids, or of their anhydrides, with diols in copolymerizable monomers, preferably styrene or methyl methacrylate.

Other examples of liquid polymeric starting materials are the oligomeric and polymeric resins and hardeners which are used in preparing epoxy resins and which bear epoxy groups.

Examples of liquid epoxy resins are aromatic polyglycidyl esters, such as bisphenol A diglycidyl ester, bisphenol F diglycidyl ester, polyglycidyl esters of phenol-formaldehyde resins and of cresol-formaldehyde resins, polyglycidyl esters of phthalic, isophthelic, and terephthalic acid, and also of trimellitic acid, N-glycidyl compounds of aromatic amines and of heterocyclic nitrogen bases, and also di- and polyglycidyl compounds of polyhydric aliphatic alcohols.

Examples of liquid hardeners are polyamines, such as triethylenetetramine, aminoethylpiperazine, isophoronediamine, polyamidoamine, polybasic acids, anhydrides of polybasic acids, phthalic anhydride, hexahydrophthalic anhydride, methyltetrahydrophthalic anhydride, or phenols.

Examples of suitable solvents are acetone, methyl ethyl ketone, alcohols, water, benzene, toluene, xylenes, esters, dimethylformamide, alkyl glycols, propylene glycol methyl ether acetate, diethylene glycol ethyl ether acetate, polyethylene glycol dimethyl ether, ethyl acetate, butyl acetate, dioxane, tetrahydrofuran, diethyl ether, dimethyl ether, methyl tert-butyl ether, alkanes, cycloalkanes, N-methylpyrrolidone, acetic acid, acetic anhydride, formic acid, propionic acid, petroleum spirit, amyl acetate, pyridine, carbon disulfide, dimethyl sulfoxide, dichloromethane, trichloromethane, carbon tetrachloride, nitromethane, N-dimethylacetamide, nitrobenzene.

Particularly suitable materials are the alcohols methanol, ethanol, n-propanol, isopropanol, n-butanol, isobutanol, sec-butanol, tert-butanol, n-hexanol, 2-ethylhexanol.

Suitable liquid flame retardants are triethyl phosphate, triaryl phosphates, tetraphenyl resorcinoldiphosphate, dimethyl methylphosphonate, and/or its polymers with phosphorus pentoxide, or are phosphonate esters, 5-ethyl-2-methyldioxaphosphorinan-5-ylmethylmethyl methanephosphonate, phosphoric esters, pyrophosphoric esters, alkylphosphonic acids, and/or oxalkylated derivatives thereof.

The inventive flame retardant dispersions preferably comprise the liquid component (C) and the solid components (A+B) in a ratio of from 1:9 to 9:1 by weight, particularly preferably from 1:3 to 3:1 by weight.

The flame retardant dispersions may be of low viscosity and of low solids content, but may also be of high viscosity, with high solids content.

Preference is given to quantitative proportions which give viscosities of from 2000 to 10 000 mPa s on mixing. Dispersions of this type can generally be processed successfully.

Where appropriate, dispersing additives may be used during preparation of the dispersions in order to achieve still better predispersion of the flame retardants.

To inhibit sedimentation, it is also possible to add stabilizers to the dispersions. Examples of these stabilizers are phyllosilicates and clay minerals, e.g. bentonites, montmorillonites, hectorites, saponites, and precipitated/fumed/crystalline/amorphous silicas.

The flame retardant dispersion preferably comprises from 10 to 90% by weight of component A, from 0 to 75% by weight of component B, and from 10 to 90% by weight of component C.

The flame retardant dispersion particularly preferably comprises from 10 to 65% by weight of component A, from 10 to 65% by weight of component B, and from 25 to 75% by weight of component C.

In another embodiment, the flame retardant comprises from 25 to 75% by weight of component A and from 25 to 75% by weight of component C.

The preferred process for preparing these flame retardant dispersions is the incorporation of the solid components A and B into the liquid component C by mixing, using a dissolver mixer assembly.

The invention also provides a flame-retardant thermoplastic molding composition prepared by using the inventive flame retardant dispersion.

The thermoplastic preferably comprises polymers of the type represented by HI (high-impact) polystyrene, polyphenylene ethers, polyamides, polyesters, polycarbonates, and blends or polyblends of the type represented by ABS (acrylonitrile-butadiene-styrene) or PC/ABS (polycarbonate/acrylonitrile-butadiene-styrene) or PPE/HIPS (polyphenylene ether/HI polystyrene) plastics.

The thermoplastic particularly preferably comprises polyamides, polyesters, and PPE/HIPS blends.

The thermoplastics preferably comprise fillers, e.g. glass (preferably in bead or in fiber form), oxides and/or hydroxides of the elements of the second and third main group of the Periodic Table of the Elements (preferably aluminum and magnesium), phyllosilicates and clay minerals, e.g. bentonites, montmorillonites, hectorites, saponites, precipitated/fumed/crystalline/ amorphous silicas, chalk.

Preferred additives are synergists, antioxidants, light stabilizers, lubricants, colorants, nucleating agents, or antistatic agents. Examples of the additives which may be used are stated in EP-A-0 584 567.

The invention also provides flame-retardant thermoset compositions which comprise molding compositions, coatings, or laminates composed of thermoset resins which were prepared using the inventive flame retardant dispersion.

The thermoset resins preferably comprise unsaturated polyester resins, epoxy resins, and polyurethanes.

Unsaturated polyester resins are solutions of polycondensasion products composed of saturated and unsaturated dicarboxylic acids or of their anhydrides with diols in copolymerizable monomers, preferably styrene or methyl methacrylate. UP resins are cured via free-radical polymerization, using initiators (e.g. peroxides) and accelerators. The double bonds of the polyester chain react with the double bond of the copolymerizable solvent monomer. The most important dicarboxylic acids for preparing the polyesters are maleic anhydride, fumaric acid, and terephthalic acid. The diol most frequently used is 1,2-propanediol. In addition, use is also made of ethylene glycol, diethylene glycol, and neopentyl glycol, inter alia. The most suitable monomer for the crosslinking process is styrene. Styrene is freely miscible with the resins, and can be copolymerized successfully. The styrene content in unsaturated polyester resins is normally from 25 to 40%. Use may also be made of methyl methacrylate as monomer instead of styrene.

Epoxy resins are compounds which are prepared via a polyaddition reaction of an epoxy resin component and of a crosslinking (hardener) component. The epoxy resin component used comprises aromatic polyglycidyl esters, such as bisphenol A diglycidyl ester, bisphenol F diglycidyl ester, polyglycidyl esters of phenol-formaldehyde resins and of cresol-formaldehyde resins, polyglycidyl esters of phthalic, isophthalic, and terephthalic acid, and also of trimellitic acid, N-glycidyl compounds of aromatic amines and of heterocyclic nitrogen bases, and also di- and polyglycidyl compounds of polyhydric aliphatic alcohols.

Hardeners used comprise polyamines, such as triethylenetetramine, aminoethylpiperazine, and isophoronediamine, polyamidoamines, a polybasic acid, or anhydrides of these, such as phthalic anhydride, hexahydrophthalic anhydride, methyltetrahydrophthalic anhydride, or phenols. The crosslinking may also take place via polymerization using suitable catalysts.

Epoxy resins are suitable for the potting of electrical or electronic components, and for saturation and impregnation processes. The epoxy resins used in electrical engineering are mainly rendered flame-retardant and used for printed circuit boards and insulators.

The prior art has hitherto rendered epoxy resins for printed circuit boards flame retardant via a reaction to incorporate bromine-containing aromatic compounds, in particular tetrabromobisphenol A. A disadvantage is that in the event of a fire hydrogen bromide (a hazardous substance!) is liberated, and this can lead to corrosion damage. Polybrominated dibenzodioxins and furans can also be produced under adverse conditions. The elimination of water during processing makes it completely impossible to use aluminum hydroxide.

The fire-protection of electrical and electronic equipment has been specified in specifications and standards relating to product safety. In the USA, Underwriters Laboratories (UL) carry out the procedures for testing and approval related to fire protection. The UL specifications are nowadays accepted worldwide. The fire tests for plastics were developed in order to determine the resistance of the materials to ignition and spread of flame.

Depending on the fire-protection requirements, the materials have to pass horizontal burning tests (UL 94 HB classification), or the more stringent vertical tests (UL 94 V-2, V-1, or V-0). These tests simulate low-energy ignition sources which arise in electrical devices and can affect plastics components of electrical modules.

The flame retardant dispersions of the invention are preferably used in compounded materials whose further use is the production of polymer moldings.

The invention also provides polymer moldings which have been produced from the flame retardant dispersion of the invention.

The flame retardant dispersions are incorporated into thermosets via homogeneous mixing with the corresponding resin/hardener systems, followed by curing and shaping.

The flame retardant dispersions may be incorporated into thermoplastic polymers, by, for example, premixing all of the constituents in a mixer and then homogenizing the mixture in the polymer melt in a compounding assembly (e.g. a twin-screw extruder). The melt is usually drawn off in the form of a strand, cooled, and pelletized. The components may also be separately introduced by way of a metering system directly into the compounding assembly.

It is also possible to admix the flame retardant dispersions with a ready-to-use polymer which takes the form of pellets or powder, and to process the mixture directly on an injection-molding machine, to give moldings.

One universal way of determining the flame-resistance of materials has proven to be determination of what is known as the oxygen index. This testing system uses a vertically arranged test specimen to determine the limiting oxygen concentration for burning to proceed in a vertical direction. The oxygen index (LOI) was determined in a modified apparatus using a method based on ASTM D2863-74.

EXAMPLES

Components used:

®Alpolit SUP 403 BMT (Vianova Resins GmbH, Wiesbaden), unsaturated polyester resin, about 57% strength in styrene, acid number not more than 30 mg KOH/g, pre-accelerated and adjusted to be slightly thixotropic, low-viscosity (viscosity in 4 mm flow cup: 110±10 s) and greatly reduced styrene emission.

®Palatal 340 S (DSM-BASF Structural Resins, Ludwigshafen) unsaturated polyester resin, about 49% strength in styrene and methyl methacrylate, density 1.08 g/ml, acid number 7 mg KOH/g, pre-accelerated, low-viscosity (dynamic viscosity about 50 mPa*s).

®Beckopox EP 140 (Viano Resins GmbH, Wiebaden), low molecular-weight condensation product of bisphenol A and epichlorohydrin with a density of 1.16 g/ml and an epoxy equivalent of 180-192.

®Beckopox EH 625 (Vianova Resins GmbH, Wiesbaden), modified aliphatic polyamine with an active hydrogen equivalent weight of 73 and a dynamic viscosity of about 1 000 mPa*s.

Cobalt accelerator NL 49P (Akzo Chemie GmbH, Düren), cobalt octoate solution in dibutyl phthalate with a cobalt content of 1% by weight.

®Butanox M 50 (Akzo Chemi GmbH, Düren), methyl ethyl ketone peroxide, phlegmatized with dimethyl phtalate, clear liquid with an active oxygen content of at least 9% by weight.

®Dowanol PMA (Dow), propylene glycol methyl ether acetate.

®Durethan AKV 30 (Bayer AG, Germany) nylon-6,6 (GRPA 6.6), comprising 30% of glass fibers.

®Celanex 2300 GV1/30 (Ticona, Germany) polybutylene terephthalate (GRPBT), comprising 30% of glass fibers.

Aluminum salt of diethylphosphinic acid, termed DEPAL below.

®Melapur 200 (melamine polyphosphate), termed MPP below, DSM Melapur, Netherlands.

Examples 1 to 9

Flame retardant dispersions were prepared with the aid of a dissolver mixer apparatus, by taking the liquid component as an initial charge and introducing the solid over a period of 10 min, with vigorous stirring. The mixture was then homogenized for a further 30 min at room temperature.

TABLE 1

| | Flame retardant dispersions | | | | |
|---|---|---|---|---|---|
| Ex. | Solid (component A or A + B) | % by weight | Liquid (component C) | % by weight | Viscosity [mPa s] |
| 1 | DEPAL | 25 | ® Alpolit SUP 403 BMT | 75 | 6300 |
| 2 | DEPAL | 25 | ® Palatal 340 S | 75 | 7200 |
| 3 | DEPAL | 50 | Styrene | 50 | 4800 |
| 4 | DEPAL | 20 | ® Beckopox EP | 80 | 8200 |

TABLE 1-continued

| | Flame retardant dispersions | | | |
|---|---|---|---|---|
| Ex. | Solid (component A or A + B) | % by weight | Liquid (component C) | % by weight | Viscosity [mPa s] |
| 5 | DEPAL | 50 | Methyl ethyl ketone | 50 | 2750 |
| 6 | DEPAL | 50 | Toluene | 50 | 3050 |
| 7 | DEPAL | 50 | Dowanol PMA | 50 | 2460 |
| 8 | DEPAL | 50 | Tetraphenyl resorcinol-diphosphate | 50 | 6700 |
| 9 | DEPAL/MPP (1:1) | 50 | Tetraphenyl resorcinol-diphosphate | 50 | 6450 |

Examples 10 to 11 (Comparison)

The unsaturated polyester resin is first mixed with the cobalt accelerator, and then mixed with the flame retardant solid (component A), using a dissolver disk. The peroxide hardener Butanox M 50 is added and then the mixture is again homogenized. Two layers of continuous glass textile mat whose weight per unit area is 450 g/m² are inserted within a heated press, on a ®Hostaphan release film and a steel frame. About half of the resin/flame retardant mixture is then uniformly distributed. Another glass mat is added, and then the remaining resin/flame retardant mixture is distributed, the laminate is covered with a release film, and a pressed plaque of thickness 4 mm is produced at a temperature of 50° C. over a period of one hour, using a pressure of 10 bar.

Examples 12 to 13

The flame retardant dispersion of examples 1 and 2 is treated with the cobalt accelerator and then mixed, using a dissolver disk. The peroxide hardener Butanox M 50 is added, and then the mixture is again homogenized, and a pressed plaque is produced as in examples 10 and 11.

Examples 14 and 15

The flame retardant dispersion of example 3 and the respective unsaturated polyester resin are treated with the cobalt accelerator and then mixed, using a dissolver disk. The peroxide hardener Butanox M 50 is added, and then the mixture is again homogenized, and a pressed plaque is produced as in examples 10 to 13.

Table 2 shows comparative examples relating to the use of DEPAL as flame retardant for unsaturated polyester resins (Viapal UP 403 BMT and ®Alpolit SUP 403 DMT). From the table it can be seen that the use of 25 parts of solid DEPAL per 100 parts of unsaturated polyester resin (comparative examples 10-11) gives relatively low values for the oxygen index (LOI), and that the surface is observed to be rough and blemished.

The use of DEPAL in the form of a dispersion (examples 12 to 15) can not only achieve higher oxygen index values (LOIs) but also unimpaired surface finish. The laminates may be colored as desired.

TABLE 2

Properties of unsaturated polyester resin laminates with 30% by weight of continuous glass textile mat, hardener Butanox M50, accelerator NL 49 P, final concentration in each case 25 parts of flame retardant per 100 parts of resin

| Example | Flame retardant dispersion | Resin | Surface | LOI |
|---|---|---|---|---|
| 10 (comp.) | DEPAL* | ® Palatal 340 S | rough/blemished | 0.30 |
| 11 (comp.) | DEPAL* | ® Alpolit SUP 403 BMT | rough/blemished | 0.32 |
| 12 | of example 1 | ® Palatal 340 S | smooth/homogeneous | 0.38 |
| 13 | of example 2 | ® Alpolit SUP 403 | smooth/homogeneous | 0.39 |
| 14 | of example 3 | ® Palatal 340 S | smooth/homogeneous | 0.40 |
| 15 | of example 3 | ® Alpolit SUP 403 BMT | smooth/homogeneous | 0.41 |

*as solid

Example 16 (Comparison)

The epoxy resin Beckopox EP 140 is mixed with the flame retardant solid, using a dissolver disk. The mixture is homogenized again after addition of the hardener Beckopox EH 625. The resin/flame retardant mixture is applied to a steel plate, and a glass silk fabric whose weight per unit area is 86 g/m² is superposed. Further resin/flame retardant mixture is then applied, and a layer of glass silk fabric whose weight per unit surface area is 390 g/m² is superposed. This procedure is repeated a further four times and is followed by curing for 3 h at 120° C. This gives a laminate of thickness about 3 mm.

Example 17

The flame retardant dispersion of example 4 is homogenized with the hardener Beckopox EH 625. The resin/flame retardant mixture is processed as described in example 16 to give a laminate of thickness about 3 mm.

Examples 18 to 20

The epoxy resin Beckopox EP 140 is mixed with the flame retardant dispersions of examples 5 to 7, using a dissolver disk. The mixture is again homogenized after adding the hardener Beckopox EH 625. The resin/flame retardant mixture is processed as described in example 16 to give a laminate of thickness about 3 mm.

Table 3 shows results from epoxy resin laminates based on the resin Beckopox EP 140 and of the polyamine hardener Beckopox EH 625. Use of the flame retardant DEPAL in the form of a dispersion (examples 17 to 20) can achieve not only higher oxygen index values (LOIs) but also an unimpaired surface finish. The laminates of the invention also withstand accelerated aging (1 h/120° C./100% rel. humidity) with none of the undesired delamination which is observable when the solid is used.

TABLE 3

Properties of epoxy resin moldings, thickness of material 3.0 mm; resin: 100 parts of Beckopox EP 140, hardener: 39 parts of Beckopox EH 625, final concentration in each case 20 parts of flame retardant per 100 parts of resin

| Example | Flame retardant dispersion | 1 h of aging at 120° C./ 100% rel. humidity | Surface | LOI |
|---|---|---|---|---|
| 16 (comp.) | DEPAL* | delamination | rough/blemished | 0.30 |
| 17 | of example 4 | no delamination | smooth/homogeneous | 0.39 |
| 18 | of example 5 | no delamination | smooth/homogeneous | 0.38 |
| 19 | of example 6 | no delamination | smooth/homogeneous | 0.39 |
| 20 | of example 7 | no delamination | smooth/homogeneous | 0.40 |

*as solid

Examples 21 to 22 (Comparison)

The glass fiber-reinforced pellets of polyamide or of PBT were extruded in a twin-screw extruder (Leistritz LSM 30/34) at temperatures of from 260 to 310° C. (GRPA 6.6) and, respectively from 240 to 280° C. (GRPBT). The flame retardant powder was fed into the molten polymer by way of a lateral feed. The homogenized polymer strand was drawn off, cooled in a waterbath, and then pelletized. After adequate drying, the molding compositions were processed on an injection-molding machine (Arburg 320 C Allrounder) at melt temperatures of from 270 to 320° C. (GRPA 6.6) and, respectively, from 260 to 280° C. (GRPBT), to give test specimens.

Examples 23 to 26

The glass fiber-reinforced pellets of polyamide or of PBT were extruded in a twin-screw extruder (Leistritz LSM 30/34) at temperatures of from 260 to 310° C. (GRPA 6.6) and, respectively from 240 to 280° C. (GRPBT). The flame retardant dispersions were fed into the molten polymer by way of a lateral feed. The homogenized polymer strand was drawn off, cooled in a waterbath, and then pelletized. After adequate drying, the molding compositions were processed on an injection-molding machine (Arburg 320 C Allrounder) at melt temperatures of from 270 to 320° C. (GRPA 6.6) and, respectively, from 260 to 280° C. (GRPBT), to give test specimens.

From table 4 it can be seen that the use of 20% of solid DEPAL (comparative examples 21 to 22) gives relatively low values for the oxygen index (LOI) and the surface is observed to be rough and blemished. Use of DEPAL in the form of dispersions (examples 23 to 26) can give not only higher oxygen index values (LOIs) but also an unimpaired surface finish.

TABLE 4

Properties of flame-retardant moldings based on polyamide (PA 6.6) or polybutylene terephthalate (PBT); in each case 20% flame retardant content

| Example | Flame retardant dispersion | Polymer | Surface | LOI |
|---|---|---|---|---|
| 21 (comp.) | DEPAL* | ® Celanex 2300 GV1/30 | rough/blemished | 0.30 |
| 22 (comp.) | DEPAL* | ® Durethan AKV 30 | rough/blemished | 0.31 |
| 23 | of example 8 | ® Celanex 2300 GV1/30 | smooth/homogeneous | 0.39 |
| 24 | of example 9 | ® Celanex 2300 GV1/30 | smooth/homogeneous | 0.39 |
| 25 | of example 8 | ® Durethan AKV 30 | smooth/homogeneous | 0.41 |
| 26 | of example 9 | ® Durethan AKV 30 | smooth/homogeneous | 0.40 |

The invention claimed is:

1. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

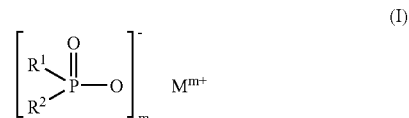

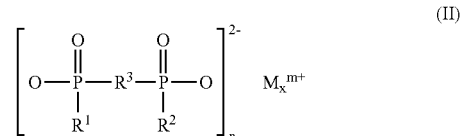

where
$R^1$ and $R^2$ are identical or different and are $C_1$-$C_6$-alkyl, linear or branched, or aryl;
$R^3$ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is a diol.

2. The flame retardant dispersion as claimed in claim 1, wherein $R^1$ and $R^2$ are identical or different, and are $C_1$-$C_6$-alkyl, linear or branched, or phenyl.

3. The flame retardant dispersion as claimed in claim 1, wherein $R^1$ and $R^2$ are identical or different and are methyl, ethyl, n-propyl, isopropyl, n-butyl, tert-butyl, n-pentyl, or phenyl.

4. The flame retardant dispersion as claimed in claim 1, wherein $R^3$ is methylene, ethylene, n-propylene, isopropylene, n-butylene, tert-butylene, n-pentylene, n-octylene or n-dodecylene; phenylene or naphthylene; methylphenylene, ethylphenylene, tert-butylphenylene, methylnaphthylene, ethylnaphthylene or tert-butylnaphthylene; phenylmethylene, phenylethylene, phenylpropylene, or phenylbutylene.

5. The flame retardant dispersion as claimed in claim 1, wherein M is aluminum ions or zinc ions.

6. The flame retardant dispersion as claimed in claim 1, wherein component B is a condensation product of melamine.

7. The flame retardant dispersion as claimed in claim 5, wherein the condensation product of melamine is melem, melam, melon or compounds thereof having higher condensation levels.

8. The flame retardant dispersion as claimed in claim 1, wherein component B is the reaction product of melamine with polyphosphoric acid, the reaction product of condensation products of melamine with polyphosphoric acid, or a mixture thereof.

9. The flame retardant dispersion as claimed in claim 8, wherein the reaction product is dimelamine pyrophosphate, melamine polyphosphate, melem polyphosphate, melam polyphosphate, melon polyphosphate, or mixed polysalts of this type.

10. The flame retardant dispersion as claimed in claim 1, wherein component B is melamine polyphosphate.

11. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

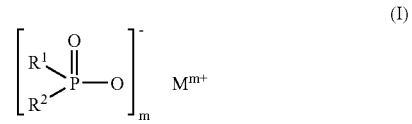

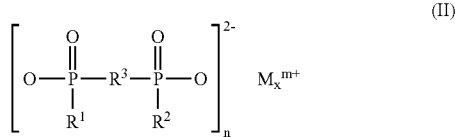

where
R$^1$ and R$^2$ are identical or different and are C$_1$-C$_6$-alkyl, linear or branched, or aryl;
R$^3$ is C$_1$-C$_{10}$-alkylene, linear or branched, -alkylarylene, or -arylalkylene;
M is Mg, Ca, Al, Sb, Sn, Ge, Ti, Zn, Fe, Zr, Ce, Bi, Sr, or Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, and wherein the flame retardant is a dispersion and wherein component C is ethylene glycol, 1,2-propanediol, 1,3-propanediol, or a butanediol.

12. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

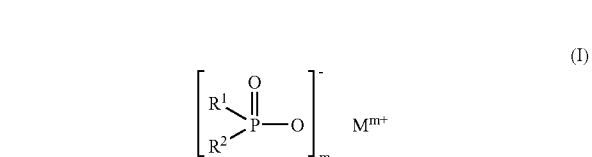

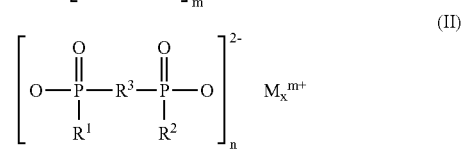

where
R$^1$ and R$^2$ are identical or different and are C$_1$-C$_6$-alkyl, linear or branched, or aryl;
R$^3$ is C$_1$-C$_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is ethylenediamine, propylenediamine, tetra-, penta-, or hexa-methylenediamine.

13. A flame retardant dispersion comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

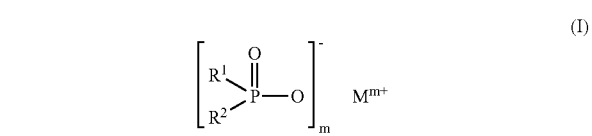

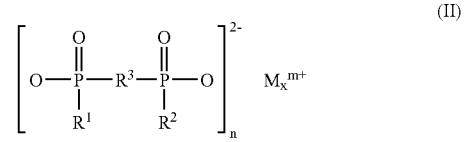

where
R$^1$ and R$^2$ are identical or different and are C$_1$-C$_6$-alkyl, linear or branched, or aryl;
R$^3$ is C$_1$-C$_{10}$-alkylene, linear or branched, C$_6$-C$_{10}$-arylene -alkylarylene, or -arylalkylene;
M is Mg, Ca, Al, Sb, Sn, Ge, Ti, Zn, Fe, Zr, Ce, Bi, Sr, Mn, Li, Na or K;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein component C is an olefinic compound.

14. A flame retardant dispersion comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

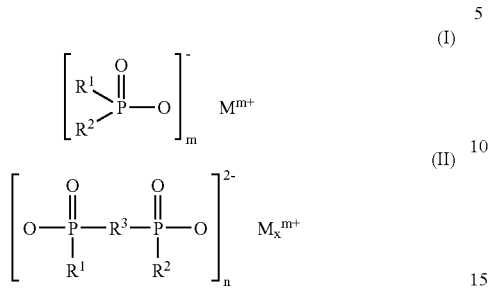

where
R¹ and R² are identical or different and are $C_1$-$C_6$-alkyl, linear or branched, or aryl;
R³ is $C_1$-$C_{10}$-alkylene, linear or branched, $C_8$-$C_{10}$arylene, -alkylarylene, or -arylalkylene;
M is Mg, Ca, Al, Sb, Sn, Ge, Ti, Zn, Fe, Zr, Ce, Bi, Sr, Mn, Li, Na or K;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein component C is a styrene or methyl methacrylate.

15. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

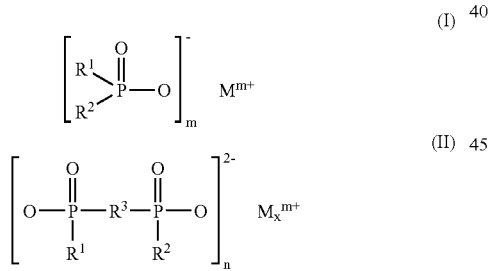

where
R¹ and R² are identical or different and are $C_1$-$C_6$-alkyl, linear or branched, or aryl;
R³ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as compoonent B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is a diisocyanate.

16. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

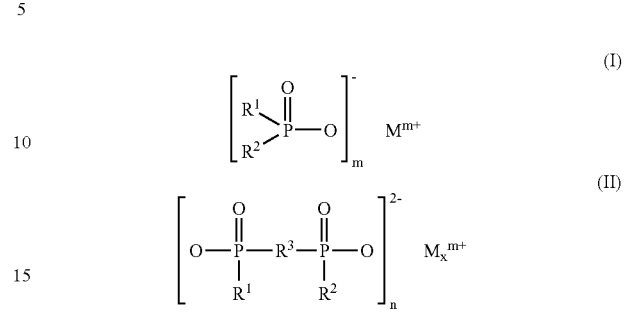

where
R¹ and R² are identical or different and are $C_1$-$C_6$-alkyl, linear or branched, or aryl;
R³ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is tolylene 2,4-diisocyanate (2,4-TDI), tolyene 2,6-diisocyanate (2,6-TDI), 4,4'-diisocyanatodiphenylmethane (MDI), naphthalene 1,5-diisocyanate (NDI), hexamethylene 1,6-diisocyanate (HDI), or isophorone diisocyanate (IPDI).

17. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

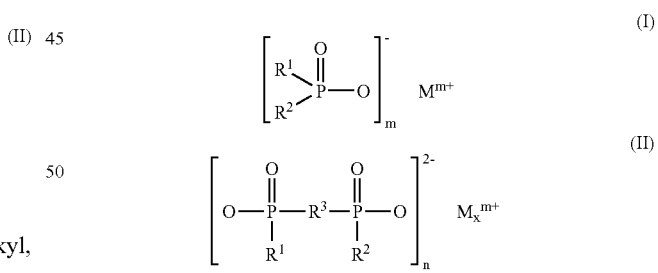

where
R¹ and R² are identical or different and are $C_1$-$C_6$-alkyl, linear or branched, or aryl;
R³ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is a polyol or a polyisocyanate.

18. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

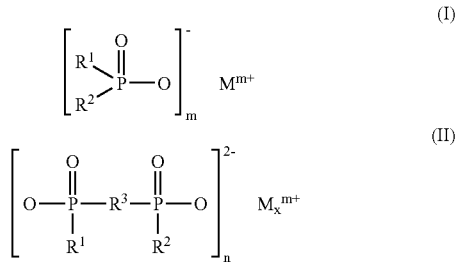

where $R^1$ and $R^2$ are identical or different and are $C_1$-$C_6$-alkyl, linear or branched, or aryl;

$R^3$ is $C_1$-$C_{10}$-alkylene, linear or branched, -alkylarylene, or -arylalkylene;

M is Mg, Ca, Al, Sb, Sn, Ge, Ti, Zn, Fe, Zr, Ce, Bi, Sr, Mn;

m is from 1 to 4;

n is from 1 to 4;

x is from 1 to 4;

and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is selected from the group consisting of polyethylene glycols, polypropylene glycols, polyether polyols, and polyester polyols.

19. A flame retardant dispersion comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

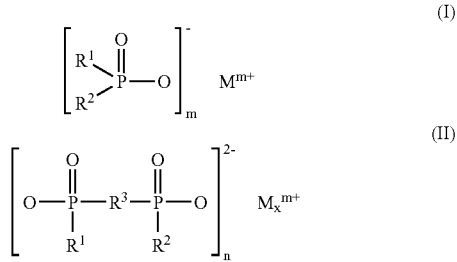

where $R^1$ and $R^2$ are identical or different and are $C_1$-$C_6$-alkyl, linear or branched, or aryl;

$R^3$ is $C_1$-$C_{10}$-alkylene, linear or branched, $C_6$-$C_{10}$-arylene, -alkylarylene, or -arylalkylene;

M is Mg, Ca, Al, Sb, Sn, Ge, Ti, Zn, Fe, Zr, Ce, Bi, Sr, Mn, Li, Na or K;

m is from 1 to 4;

n is from 1 to 4;

x is from 1 to 4, and as component B, from 0 to 75% by weight of a nitrogen-containing synergist or of a phosphorus/nitrogen flame retardant, and as component C, from 10 to 90% by weight of a liquid component, wherein component C is a solution of polycondensation products composed of saturated and unsaturated dicarboxylic acids and/or of their anhydrides, with diols, in copolymerizable monomers.

20. The flame retardant dispersion as claimed in claim 19, wherein the copolymerizable monomers are styrene or methyl methacrylate.

21. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

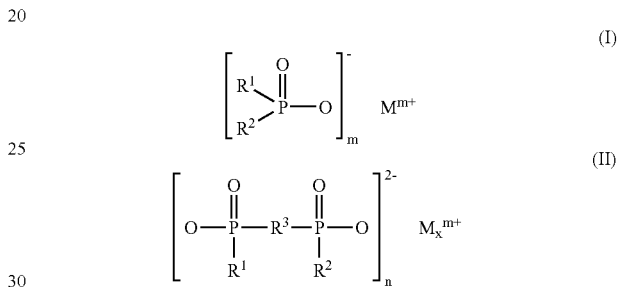

where $R^1$ and $R^2$ are identical or different and are $C_1$-$C_6$-alkyl, linear or branched, or aryl;

$R^3$ is $C_1$-$C_{10}$-alkylene, linear or branched, -alkylarylene, or -arylalkylene;

M is Mg, Ca, Al, Sb, Sn, Ge, Ti, Zn, Fe, Zr, Ce, Bi, Sr, Mn;

m is from 1 to 4;

n is from 1 to 4;

x is from 1 to 4, and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is selected from the group consisting of triethylenetetramine, aminoethylpiperazine, isophoronediamine, polyamidoamine, polybasic acids, anhydrides of polybasic acids, phthalic anhydride, hexahydrophthalic anhydride, methyltetrahydrophthalic anhydride, and phenols.

22. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

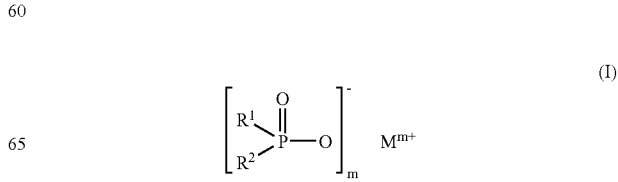

-continued

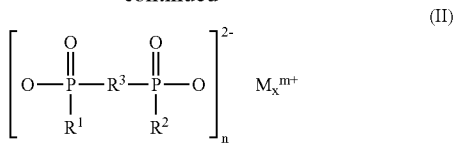

where
R¹ and R² are identical or different and are $C_1$-$C_6$-alkyl, linear or branched, or aryl;
R³ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is a liquid flame retardant.

23. A flame retardant comprising, as flame retardant component A, from 1 to 90% by weight of a component selected from the group consisting of phosphinic salt of the formula (I), a diphosphinic salt of the formula (II), a polymer of formula (I), a polymer of formula (II) and mixtures thereof

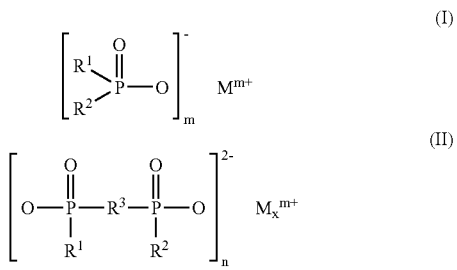

where
R¹ and R² are identical or different and are $C_1$-$C_6$-alkyl, linear or branched, or aryl;
R³ is $C_1$-$C_{10}$-alkylene, linear or branched, -alkylarylene, or -arylalkylene;
M is Mg, Ca, Al, Sb, Sn, Ge, Ti, Zn, Fe, Zr, Ce, Bi, Sr, Mn;
m is from 1 to 4;
n is from 1 to 4;
x is from 1 to 4,
and as component B, from 0 to 75% by weight of a nitrogen-containing synergist or of a phosphorus/nitrogen flame retardant, and as component C, from 10 to 90% by weight of a liquid component, wherein the flame retardant is a dispersion and wherein component C is selected from the group consisting of triethyl phosphate, triaryl phosphates, tetraphenyl resourcinoldiphosphate, dimethyl methylphosphonate, and/or its polymers with phosphorus pentoxide, phosphonate esters, 5-ethyl-2-methyldioxaphosphorinan-5-ylmethylmethyl methanephosphonate, phosphoric esters, pyrophosphoric esters, alkylphosphonic acids, and oxalkylated derivatives thereof.

24. The flame retardant dispersion as claimed in claim 1, comprising from 10 to 90% by weight of component A, from 0 to 75% by weight of component B, and from 10 to 90% by weight of component C.

25. The flame retardant dispersion as claimed in claim 1, comprising from 10 to 65% by weight of component A, from 10 to 65% by weight of component B, and from 25 to 75% by weight of component C.

26. The flame retardant dispersion as claimed in claim 1, comprising from 25 to 75% by weight of component A and from 25 to 75% by weight of component C.

27. A process for preparing a flame retardant dispersion as claimed in claim 1 comprising the step of mixing the solid components A and B into the liquid component C.

28. A process for preparing a flame retardant dispersion as claimed in claim 27, wherein the mixing step further comprises mixing at least one additive into the liquid component C.

29. A process for preparing a flame retardant dispersion as claimed in claim 28, wherein the at least one additive is selected from the group consisting of phyllosilicates, clay minerals, bentonites, montmorillonites, hectorites, saphonites, and precipitated/fumed/crystalline/amorphous silicas.

30. A method for making a flame-retardant thermoplastic polymer molding composition comprising the step of adding a flame retardant dispersion as claimed in claim 28 to the flame-retardant thermoplastic polymer molding composition during manufacture of the flame-retardant thermoplastic polymer molding composition.

31. The flame-retardant thermoplastic polymer molding composition as claimed in claim 30, wherein the thermoplastic polymer is selected from the group consisting of HI (high-impact) polystyrene, polyphenylene ethers, polyamides, polyesters, polycarbonates, and blends or polyblends of the type represented by ABS (acrylonitrile-butadiene-styrene) or PC/ABS (polycarbonate/acrylonitrile-butadiene-styrene) or PPE/HIPS (polyphenylene ether/HI polystyrene) plastics.

32. The flame-retardant thermoplastic polymer molding composition as claimed in claim 30, wherein the thermoplastic polymer is selected from the group consisting of polyamides, polyesters, and PPE/HIPS blends.

33. A method for making a flame-retardant thermoset resin composition comprising the step of adding a flame retardant dispersion as claimed in claim 1 to the thermoset resin composition during manufacture of the thermoset resin composition, wherein the thermoset resin composition is a molding composition, a coating or a laminate.

34. The flame-retardant thermoset composition as claimed in claim 33, wherein the thermoset resin is selected from the group consisting of unsaturated polyester resins, epoxy resins, and polyurethanes.

35. A polymer article comprising a molding composition as claimed in claim 30, wherein the polymer article is selected from the group consisting of a polymer fiber, filament, and film.

36. A process for preparing a flame retardant dispersion as claimed in claim 27, wherein the mixing step further comprises mixing solid components A and B into the liquid component C with a dissolver mixer assembly.

* * * * *